United States Patent
Raberg

(10) Patent No.: US 12,467,989 B2
(45) Date of Patent: Nov. 11, 2025

(54) MAGNETIC SENSOR DEVICE

(71) Applicant: Infineon Technologies AG, Neubiberg (DE)

(72) Inventor: Wolfgang Raberg, Sauerlach (DE)

(73) Assignee: Infineon Technologies AG, Neubiberg (DE)

(*) Notice: Subject to any disclaimer, the term of this patent is extended or adjusted under 35 U.S.C. 154(b) by 326 days.

(21) Appl. No.: 18/194,179

(22) Filed: Mar. 31, 2023

(65) Prior Publication Data

US 2023/0324477 A1    Oct. 12, 2023

(30) Foreign Application Priority Data

Apr. 5, 2022    (DE) .......................... 102022108102.8

(51) Int. Cl.
  *G01R 33/09*    (2006.01)
  *H01L 29/76*    (2006.01)

(52) U.S. Cl.
  CPC ................................. *G01R 33/098* (2013.01)

(58) Field of Classification Search
  CPC ....... G01R 33/09; G01R 33/098; H01L 29/76; H01L 29/82; H01L 29/94
  See application file for complete search history.

(56) References Cited

U.S. PATENT DOCUMENTS

| 7,157,760 B2 * | 1/2007 | Kamijima | H10B 61/10 257/E27.005 |
| 10,317,480 B2 | 6/2019 | Raberg et al. | |
| 2005/0052903 A1 * | 3/2005 | Hayashi | G11C 11/15 365/158 |
| 2013/0009258 A1 * | 1/2013 | Lee | H10B 61/00 257/E29.323 |
| 2016/0018481 A1 | 1/2016 | Cambou et al. | |

FOREIGN PATENT DOCUMENTS

| DE | 102013102903 A1 | 1/2014 |
| DE | 102015117547 A1 | 4/2016 |
| DE | 102016000257 A1 | 7/2016 |
| DE | 102016112008 A1 | 1/2018 |
| DE | 102018120127 A1 | 9/2019 |
| DE | 112020001831 T5 | 12/2021 |
| EP | 2284557 B1 | 5/2012 |

* cited by examiner

*Primary Examiner* — Neel D Shah
(74) *Attorney, Agent, or Firm* — Harrity & Harrity, LLP

(57) ABSTRACT

The present disclosure relates to a magnetic sensor device, including a substrate spanning a plane, a plurality of series-connected TMR resistance elements arranged on the substrate, wherein each of the TMR resistance elements has at least one magnetic tunnel contact and wherein each of the TMR resistance elements has the same reference magnetization. The series-connected TMR resistance elements are arranged and interconnected on the substrate in such a way that an electric current flow direction in the plane relative to the reference magnetization changes at least once along a current path through the series-connected TMR resistance elements.

11 Claims, 5 Drawing Sheets

MAGNETIC SENSOR DEVICE

CROSS REFERENCE TO RELATED APPLICATION

This application claims priority to German Patent Application No. 102022108102.8 filed on Apr. 5, 2022, the content of which is incorporated by reference herein in its entirety.

TECHNICAL FIELD

The present disclosure relates generally to magnetic sensors and in particular to TMR sensors (tunnel magnetoresistance).

BACKGROUND

Tunnel magnetoresistance (TMR) is a magnetoresistive effect that occurs in a magnetic tunnel junction (MTJ), a component which consists of two ferromagnets separated by a thin insulator. If the insulating layer is thin enough (typically a few nanometers), electrons can tunnel from one ferromagnet into the other. Magnetic tunnel junctions can be produced using thin-film technology, for example.

Present-day TMR sensors have a high drift of their sensitivity and thus of the sensor signal if they are exposed to high temperatures and/or mechanical loads.

Therefore, there is a need for TMR sensor layouts which can reduce and ideally completely cancel the drift.

SUMMARY

This need is met by devices and methods as claimed in the independent patent claims. The dependent claims relate to advantageous developments.

In accordance with a first aspect of the present disclosure, a magnetic sensor device is proposed. The magnetic sensor device comprises a substrate spanning a plane (e.g., x-y-plane). A plurality of series-connected TMR resistance elements are arranged on the substrate. Each of the TMR resistance elements has at least one magnetic tunnel contact or tunnel junction and each of the TMR resistance elements has the same reference magnetization. The series-connected TMR elements are arranged and interconnected on the substrate in such a way that an electric current flow direction in the plane relative to the reference magnetization changes at least once along a current path through the series-connected TMR resistance elements. By virtue of different electric current flow directions in the plane relative to the reference magnetization, different drifts of the TMR resistance elements as a result of mechanical loading and/or high temperatures can be balanced or mutually compensated for such that a small drift of the sensitivity of the magnetic sensor device can be obtained overall.

In accordance with some example implementations, the magnetic sensor device comprises a first subset of TMR resistance elements, through which an electric current has a first current flow direction in the (x-y-) plane and at least one second subset of TMR resistance elements, through which the electric current has a second current flow direction in the (x-y-) plane, which differs from the first current flow direction. Further subsets of TMR resistance elements having further current flow directions in the (x-y-) plane can be present.

In accordance with some example implementations, the first subset of the TMR resistance elements and the second subset of the TMR resistance elements are arranged and interconnected on the substrate in such a way that the first current flow direction in the (x-y-) plane through the first subset is perpendicular to the second current flow direction in the (x-y-) plane through the second subset. By way of example, the current can flow in the x-direction through the first subset of the TMR resistance elements. Through the second subset of the TMR resistance elements, the current can flow in the y-direction, for example, or vice versa.

In accordance with some example implementations, the first subset of the TMR resistance elements and the second subset of the TMR resistance elements are arranged and interconnected on the substrate in such a way that the first current flow direction through the first subset is parallel to the reference magnetization and the second current flow direction through the second subset is perpendicular to the reference magnetization, or vice versa. By way of example, the reference magnetization can point in the x-direction. In that case, the first current flow direction would be the x-direction and the second current flow direction would be the y-direction. Intermediate configurations can likewise be provided. In accordance with some example implementations, the first subset of the TMR resistance elements and the second subset of the TMR resistance elements are arranged and interconnected on the substrate in such a way that the first current flow direction through the first subset is +45° with respect to the reference magnetization and the second current flow direction through the second subset is −45° with respect to the reference magnetization, or vice versa.

In accordance with some example implementations, the first subset and the second subset have an identical number of TMR resistance elements. Consequently, for example different drifts of the first and second subsets can mutually cancel one another out.

In accordance with some example implementations, the reference magnetization (of a magnetic reference layer or of a reference layer system) of the TMR resistance elements runs parallel to the (x-y-) plane spanned by the substrate. The reference magnetization of all the TMR resistance elements of the magnetic sensor device is substantially identical (for example within the scope of manufacturing tolerances).

In accordance with some example implementations, the respective magnetic tunnel contacts of the TMR resistance elements are connected between first and second contacting planes (lying one above another vertically—e.g., in the z-direction) on the substrate. The current path extends between the contacting planes perpendicular to the plane through the respective magnetic tunnel contacts and in the (x-y-) plane laterally through the contacting planes. A lateral current path through the TMR resistance elements thus arises overall in the plane.

In accordance with some example implementations, each of the TMR resistance elements has a free layer in a vortex configuration. A free layer in a vortex configuration can have approximately zero hysteresis. They may be of interest in particular for applications such as for wheel speed sensing, current sensing or linear field sensing.

In accordance with a further aspect of the present disclosure, a magnetic sensor device is proposed, comprising a substrate spanning a plane, a plurality of series-connected TMR resistance elements arranged on the substrate, wherein each of the TMR resistance elements has at least one magnetic tunnel contact and wherein each of the TMR resistance elements has the same reference magnetization. The series-connected TMR elements are arranged and interconnected on the substrate in such a way that an electric current flow direction in the plane parallel to the reference magnetization arises along a current path through the series-connected TMR resistance elements. Such an arrangement of the TMR elements advantageously results in a smaller drift of the magnetic sensor device in comparison with an arrangement in which the series-connected TMR elements are arranged and interconnected on the substrate such that an electric current flow direction in the plane perpendicular to the reference magnetization arises along a current path through the series-connected TMR resistance elements.

In accordance with some example implementations, the reference magnetization (of a magnetic reference layer or of a reference layer system) of the TMR resistance elements runs parallel to the (x-y-) plane spanned by the substrate.

In accordance with some example implementations, the respective magnetic tunnel contacts of the TMR resistance elements are connected between first and second electrically conductive contacting planes (arranged one above another vertically) on the substrate. The electrically conductive contacting planes can be metallization planes, for example. The current path thus extends firstly perpendicular to the plane (CPP: current-perpendicular-to-plane) through the respective magnetic tunnel contacts and in the plane (CIP: current-in-plane) parallel to the reference magnetization through the contacting planes.

BRIEF DESCRIPTION OF THE DRAWINGS

Some examples of devices and/or methods are explained in greater detail merely by way of example below with reference to the accompanying figures, in which.

DETAILED DESCRIPTION

Some examples will now be described more thoroughly with reference to the accompanying figures. However, further possible examples are not restricted to the features of these implementations described in detail. These may have modifications of the features and counterparts and alternatives to the features. Furthermore, the terminology used herein for describing specific examples is not intended to be limiting for further possible examples.

Throughout the description of the figures, identical or similar reference signs refer to identical or similar elements or features which can be implemented in each case identically or else in modified form, while they provide the same or a similar function. In the figures, furthermore, the thicknesses of lines, layers and/or regions may be exaggerated for elucidation purposes.

If two elements A and B are combined using an "or", this should be understood such that all possible combinations are disclosed, e.g., only A, only B, and A and B, unless expressly defined otherwise in an individual case. As alternative wording for the same combinations, it is possible to use "at least one from A and B" or "A and/or B". That applies equivalently to combinations of more than two elements.

If a singular form, e.g., "a, an" and "the" is used and the use of only a single element is defined neither explicitly nor implicitly as obligatory, further examples can also use a plurality of elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage describe the presence of the specified features, integers, steps, operations, processes, elements, components and/or a group thereof, but do not exclude the presence or the addition of one or more other features, integers, steps, operations, processes, elements, components and/or a group thereof in the process.

Figure 1:
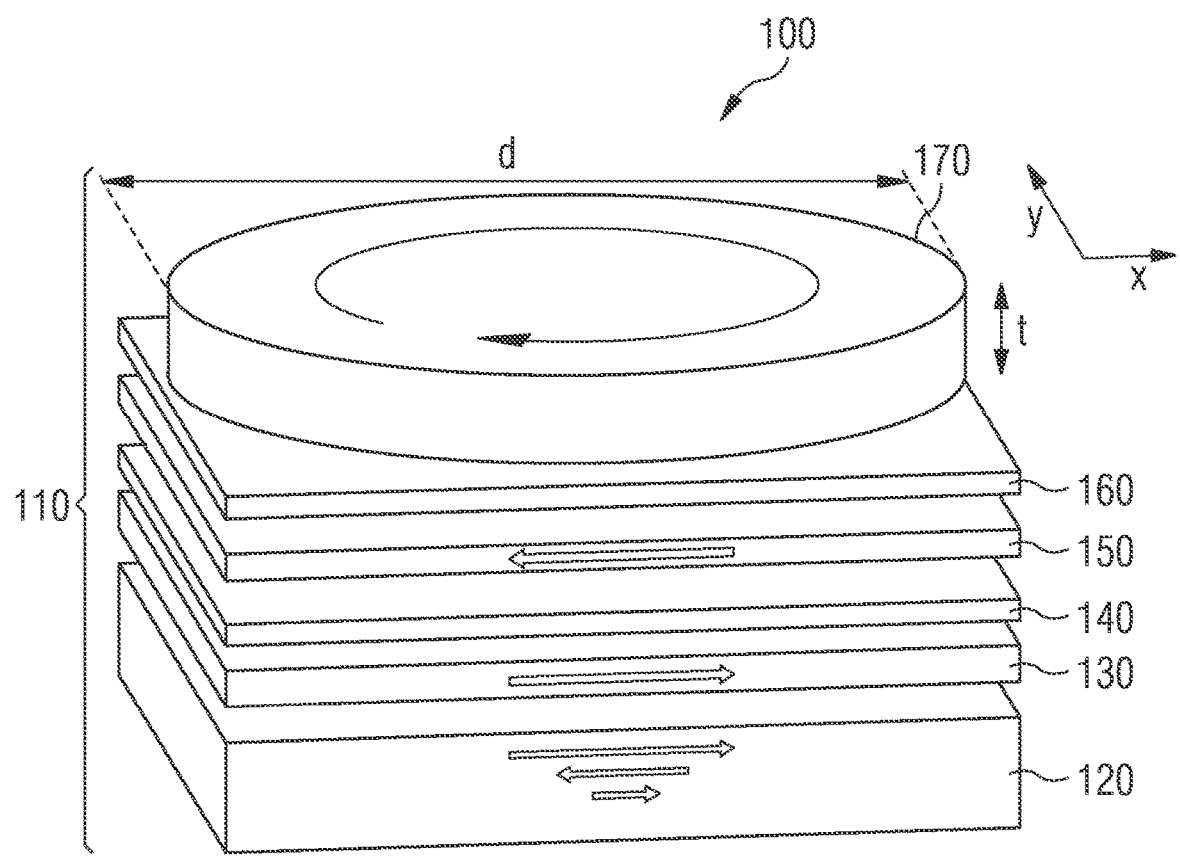
FIG. 1 shows an example layer construction of a TMR resistance element.

FIG. 1 shows one example of a TMR resistance element (TMR=tunnel-magnetoresistive) 100, which is also known as a spin valve or a bottom spin valve, BSV. The TMR resistance element 100 has a layer stack 110 composed of alternating ferromagnetic and non-ferromagnetic layers. If they are described in a Cartesian coordinate system with pairwise perpendicular coordinate axes x, y and z, the layers each extend in a plane spanned by the x-axis and y-axis. The extent of a layer in the z-direction can be described as the layer thickness t.

From bottom to top the TMR resistance element 100 has an antiferromagnetic pinning layer 120 and a ferromagnetic pinned layer 130. The contact between the pinning layer 120 and the pinned layer 130 provokes an effect known as the exchange bias effect, which causes the magnetization of the pinned layer 130 in order to align it in a preferred direction. To put it another way, the pinned layer 130 exhibits a linear magnetic flux pattern that is parallel to the x-direction in FIG. 1. The TMR resistance element 100 furthermore comprises a coupling layer 140. The coupling layer 140 can be diamagnetic and can comprise e.g., ruthenium, iridium, copper or copper alloys and similar materials. The coupling layer 140 spatially separates the pinned layer 130 from a ferromagnetic reference layer 150. Using this construction, the magnetization (reference magnetization) of the reference layer 150 can be aligned and can be kept in a direction antiparallel to the magnetization of the pinned layer 130. The TMR resistance element 100 furthermore comprises a tunnel barrier 160, which electrically insulates and separates the reference layer 150 from a free ferromagnetic layer 170. The free layer 170, the reference layer 150 and the pinned layer 130 can comprise iron, cobalt or nickel in some example implementations and alloys thereof in some further example implementations. Alloys can also comprise non-ferromagnetic materials, for example carbon, at least 50% of ferromagnetic materials consisting of a material composition of the corresponding layer. For example, layers can comprise cobalt-iron, CoFe, or nickel-iron, NiFe, alloys. In contrast thereto, the pinning layer 120 can comprise for example iridium, manganese, platinum or alloys comprising same.

During operation or if they are coupled to an electrical circuit, electrical charges can be conducted from one side of the tunnel barrier 160 to another in a predetermined amount if a constant external magnetic field is applied. The TMR effect is a quantum physical phenomenon which manifests itself in a change in the charge magnitude that is conducted through the tunnel barrier if the direction of the external magnetic field is changed. This effect can arise on account of changes in direction of the magnetization of the free layer 170 which are caused by the change in the external magnetic field.

The free layer 170 in FIG. 1 has a circular shape, or to put it another way has a disk-like structure. The disk has a diameter d, which can be in a range of one hundred nm to 10 μm, for example. The disk furthermore has a thickness t in the range of e.g., one nm to 100 or 200 nm. The provision of a layer having this structure can result in a spontaneous formation of a magnetization pattern with closed flux in the free layer 170. The occurrence of such a pattern can also be called a vortex state or a vortex configuration. To put it another way, the vortex state can be obtained by selecting the disk thickness t in the range of from 10 nm to 100 nm, for example, and the disk diameter d between 500 nm and 3 μm. The vortex spin valve structure is not limited to the TMR effect; it can also be realized by way of a GMR structure, for example.

A TMR sensor concept having a free layer in the vortex configuration can have a hysteresis of approximately zero, which may be of interest particularly for applications such as wheel speed sensing or current sensing, for example. A prerequisite for a low hysteresis may be the presence of the vortex state. Critical parameters that describe the operating state in which the vortex state exists are the nucleation field $H_n$, in which the vortex nucleates, and the annihilation field $H_{an}$, where the vortex is annihilated again.

Figure 2:
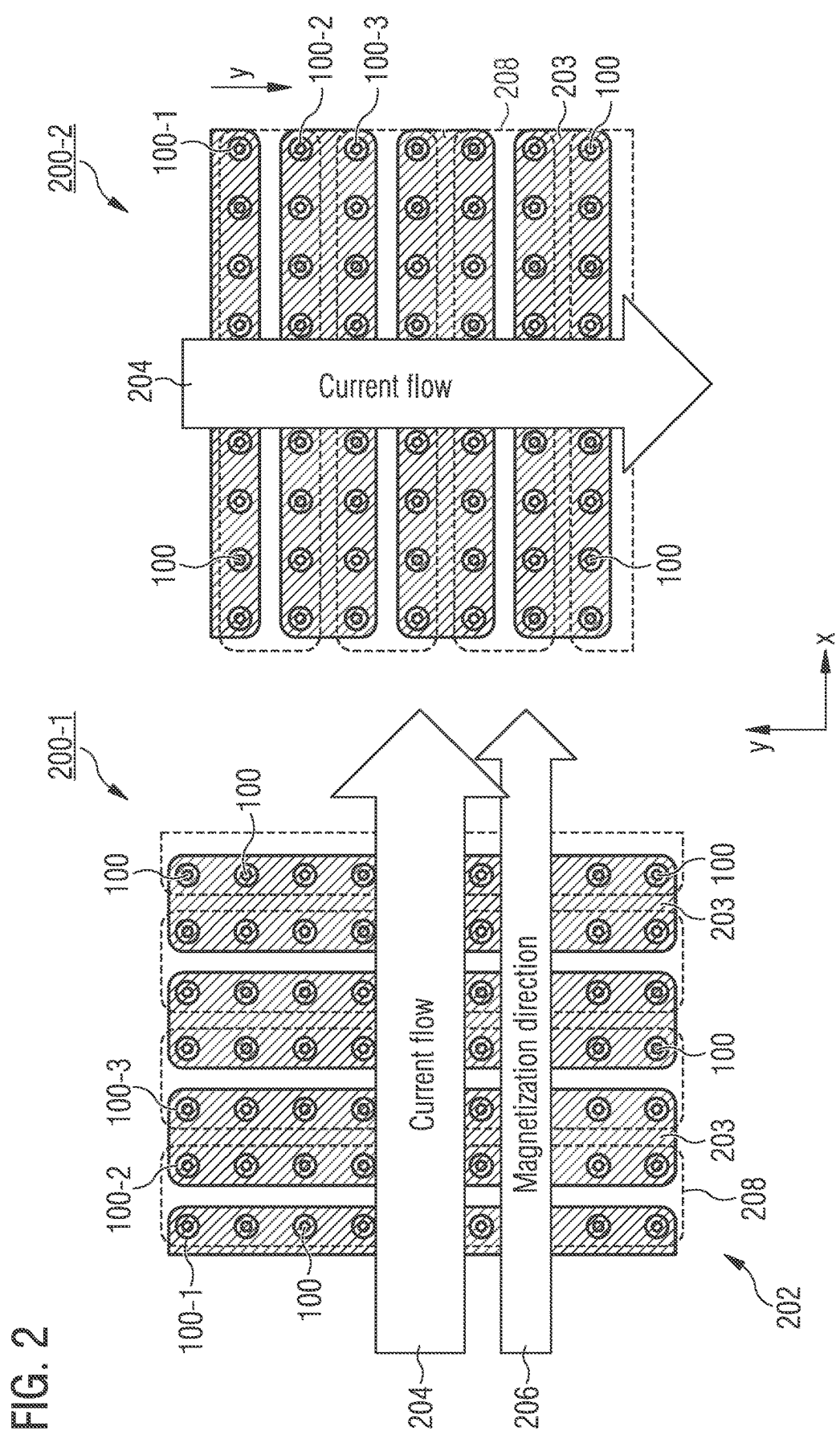
FIG. 2 shows magnetic sensor devices with a current flow direction respectively parallel and perpendicular to the reference magnetization of the TMR resistance elements.

FIG. 2 shows next to one another in a basic illustration plan views of two magnetic sensor devices 200-1, 200-2 arranged on a respective substrate 202, in particular on a semiconductor substrate. The substrate 202 spans an x-y-plane.

Each of the sensor devices 200-1, 200-2 has in each case a plurality of TMR resistance elements 100 electrically connected in series, which are arranged on the substrate 202. A TMR resistance element 100 can have exactly one magnetic tunnel contact or a plurality of parallel-connected magnetic tunnel contacts. Each of the TMR resistance elements 100, for example, as was described with reference to FIG. 1, can be constructed as a magnetic layer stack, wherein the layers are stacked one above another perpendicular to the substrate 202 (in the z-direction). The TMR resistance elements 100 are embedded (in the z-direction) in each case between upper metallization layers 203 and lower metallization layers 208 for the purpose of electrical contacting.

In the case of the sensor device 200-1 (FIG. 2, left), the TMR resistance elements 100 are connected in series and arranged next to one another laterally from left to right (in the x-direction), thus resulting in a lateral current path 204 through the series-connected TMR resistance elements 100 with an electric current flow direction through the sensor device 200-1 from left to right (in the x-direction). A column of a two-dimensional tunnel contact matrix arranged on the substrate 202 can be regarded as a TMR resistance element 100, for example. Adjacent columns of magnetic tunnel contacts in the x-direction are connected in series via upper and lower contactings 204, 208. TMR resistance element 100-1 and TMR resistance element 100-2 are electrically connected to one another via the lower contacting plane 208, for example. TMR resistance element 100-2 and TMR resistance element 100-3 are electrically connected to one another via the upper contacting plane 203.

A reference magnetization 206 is identical within the scope of manufacturing tolerances for all TMR resistance elements 100 or tunnel contacts arranged on the substrate 202 and is likewise from left to right in the example in FIG. 2 (left). The reference magnetization 206 (in the x-direction) of the TMR resistance elements 100 thus runs parallel to the current flow direction 204 (x-direction) in the case of sensor device 200-1.

The current path from TMR resistance element 100-1 to TMR resistance element 100-2 runs in the x-y-plane from left to right (CIP: current in plane) in the x-direction via the lower metallization layer 208. From the lower metallization layer 208, the current path then runs perpendicular (CPP: current perpendicular to plane) through the TMR resistance element 100-2 from the lower metallization layer 208 to the upper metallization layer 203. TMR resistance element 100-2 and TMR resistance element 100-3 are electrically connected to one another via the upper metallization layer 203 in the x-direction, such that the current path runs further from TMR resistance element 100-3 perpendicular (CPP) through the TMR resistance element 100-3 from the upper metallization layer 203 to the lower metallization layer 208, etc. TMR resistance element 100-1 and TMR resistance element 100-2 are thus connected to one another via the lower metallization layer 208, and TMR resistance element 100-2 and TMR resistance element 100-3 are connected to one another via the upper metallization layer 203. Between TMR resistance element 100-1 and TMR resistance element 100-2, the upper metallization layer 203 is interrupted for the purpose of electrical insulation, and between TMR resistance element 100-2 and TMR resistance element 100-3, the lower metallization layer 208 is interrupted for the purpose of electrical insulation.

Figure 4:
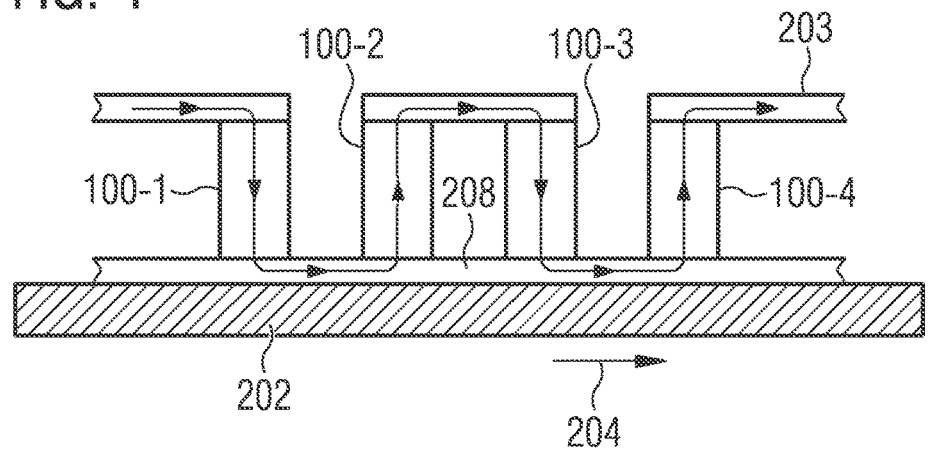
FIG. 4 shows a current flow through adjacent TMR resistance elements.

As viewed from the side, the electric current thus passes meanderingly through the magnetic sensor device 200-1. FIG. 4 shows a schematic sectional view of the magnetic sensor device 200-1. The current flows through the magnetic tunnel contacts of the TMR resistance element 100-1 in the z-direction from the upper metallization layer 203 to the lower metallization layer 208. From there the current flows further in the x-direction to the TMR resistance element 100-2 and in the latter from the lower metallization layer 208 through its magnetic tunnel contacts in the z-direction to the upper metallization layer 203. From there in the x-direction toward the right to the TMR resistance element 100-3 and in the latter from the upper metallization layer 203 through its magnetic tunnel contacts in the z-direction to the lower metallization layer 208, etc. Overall, this results in an electric current flow direction 204 in the plane in the x-direction from left to right parallel to the reference magnetization 206.

FIG. 2 (left) thus relates to a magnetic sensor device 200-1, comprising a substrate 202 spanning an (x-y-) plane. The magnetic sensor device 200-1 comprises a plurality of series-connected TMR resistance elements 100 arranged on the substrate 202, wherein each of the TMR resistance elements has at least one magnetic tunnel contact and wherein each of the TMR resistance elements 100 has the same reference magnetization 206. The series-connected TMR elements 100 are arranged and interconnected on the substrate 202 in such a way that an electric current flow direction 204 in the (x-y-) plane parallel to the reference magnetization 206 in the x-direction arises along a current path through the series-connected TMR resistance elements 100.

In the case of the sensor device 200-2 (FIG. 2, right), the TMR resistance elements 100 are connected in series and arranged one below or above another from top to bottom (in the y-direction), thus resulting in a current path 204 through the series-connected TMR resistance elements 100 with an electric current flow direction through the sensor device 200-2 from top to bottom (in the y-direction). The reference magnetization 206 is identical within the scope of manufacturing tolerances for all the TMR resistance elements 100 arranged on the substrate 202, and is likewise from left to right (in the x-direction). The reference magnetization 206 (in the x-direction) of the TMR resistance elements 100 runs perpendicular to the current flow direction 204 (y-direction) in the case of sensor device 200-2.

In the sensor device 200-2, the current flows in the y-direction from top to bottom, firstly in the upper metal 203, then through the TMR resistance elements 100 into the lower electrode 208 and back through the next row of TMR resistance elements 100 into the upper metal 203, and so on.

On account of the anisotropic surroundings, a (mechanical) stress is present which fosters the alignment of the magnetization along the perpendicular axis by virtue of the magnetoelastic effect. If high temperatures are applied, this alignment is stored in the reference system. Consequently, it is possible to observe different signal amplitudes/sensitivities for sensor devices with parallel (sensor device 200-1) and perpendicular (sensor device 200-2) alignment between reference magnetization 206 and current flow 204 (parallel vs. perpendicular) following such a high-temperature treatment. This relationship is shown in FIG. 3.

Figure 3:
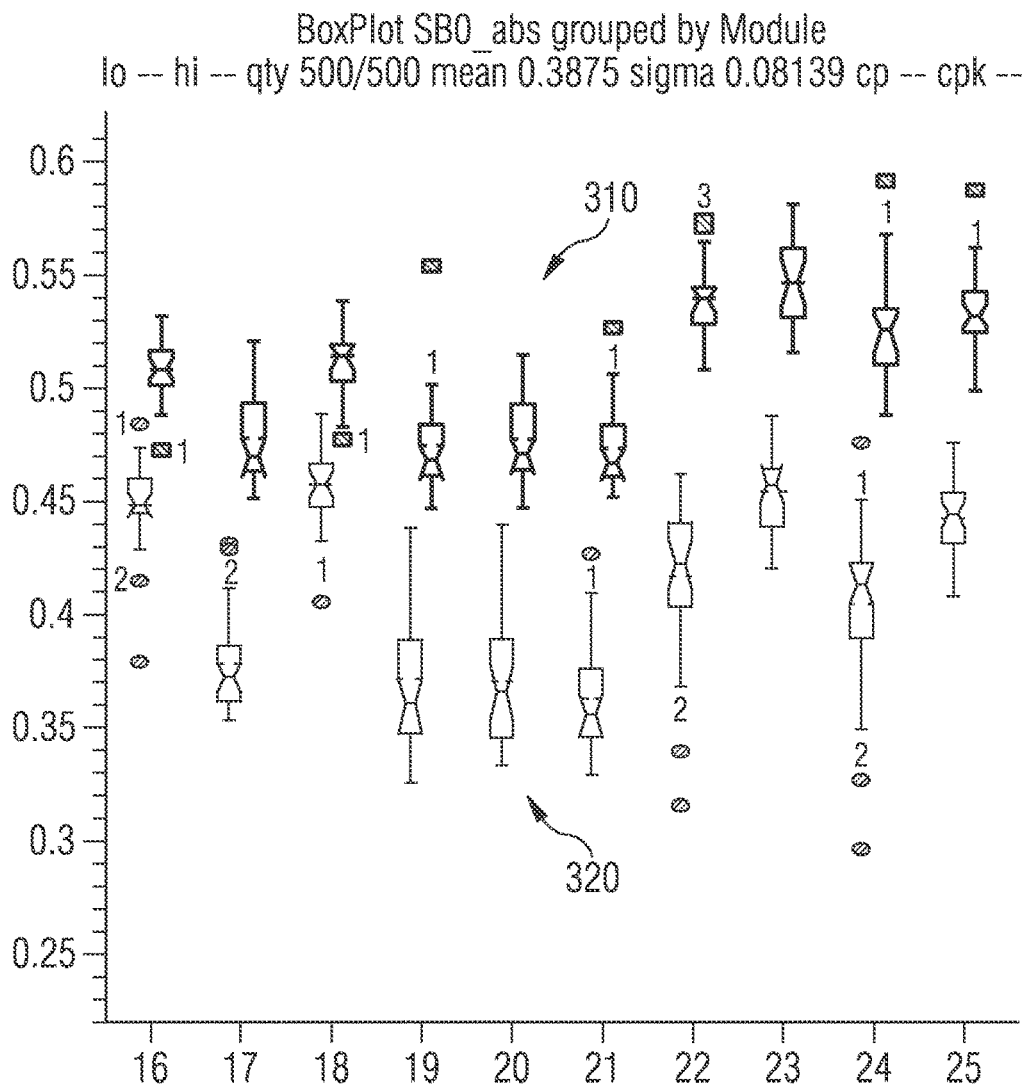
FIG. 3 shows a variation of the sensor sensitivity in the event of thermal treatment.

FIG. 3 shows on the vertical axis the sensor sensitivity after thermal treatment for parallel (reference sign 310) and perpendicular (reference sign 320) arrangement of the reference magnetization relative to the current direction for various test wafers (on the x-axis). It is evident that systematically lower sensitivities are observed for the same material (wafer) in the case of perpendicular arrangement.

A similar behavior can be observed if a purely mechanical stress is exerted on such a sensor device from outside, which confirms that mechanical stress is the reason for varying behavior. In actual fact, the sign of the signal change changes depending on whether the mechanical stress is applied perpendicular or parallel to the reference magnetization direction.

A more robust TMR sensor in this regard can be attained by way of different current flow directions in the x-y-plane within a TMR resistance. This is indicated schematically in FIGS. 5 and 6.

Figure 5:
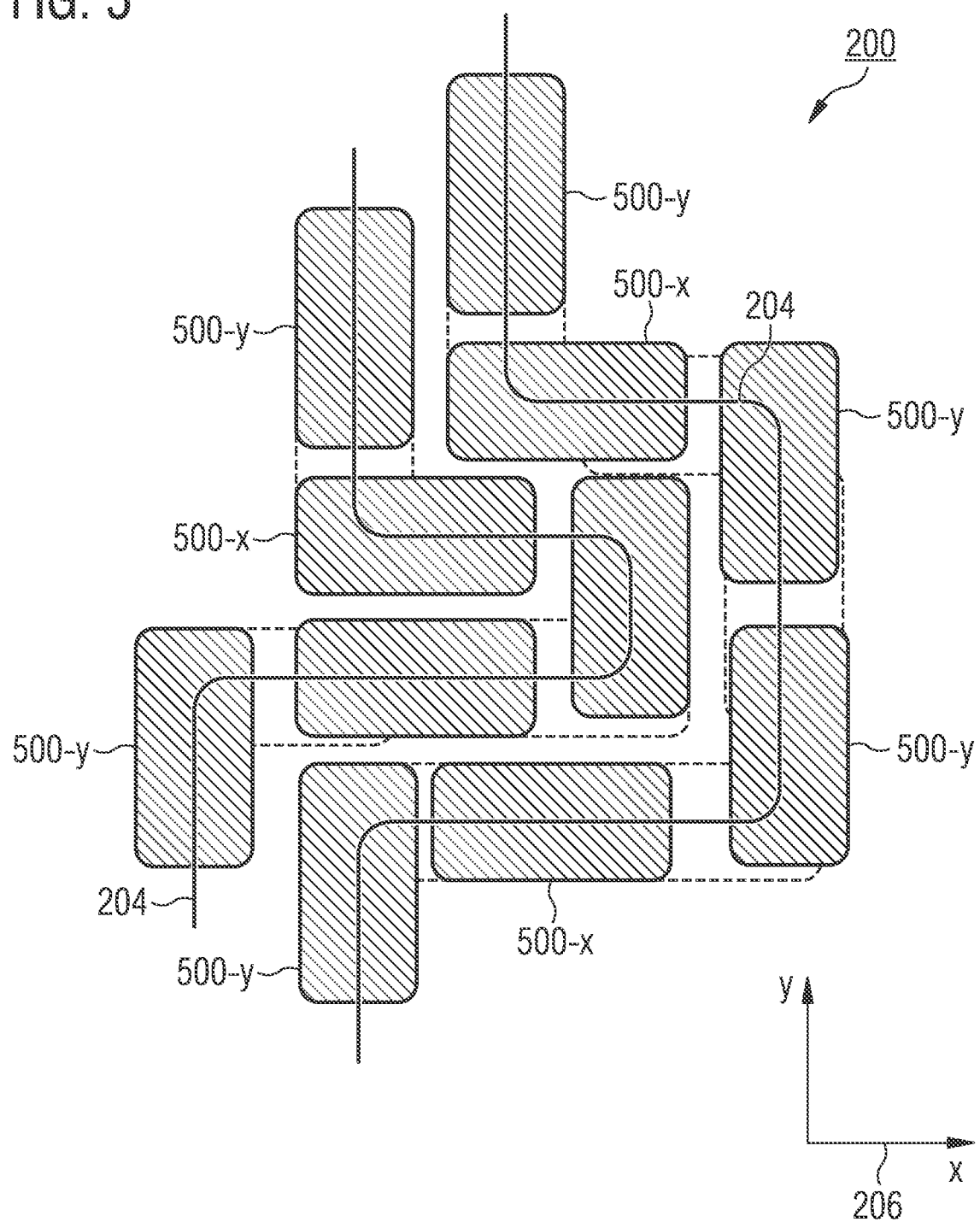
FIG. 5 shows a magnetic sensor device in which the series-connected TMR elements are arranged and interconnected on a substrate in such a way that an electric current flow direction in the plane relative to a reference magnetization changes at least once along a current path through the series-connected TMR resistance elements.
Figure 6:
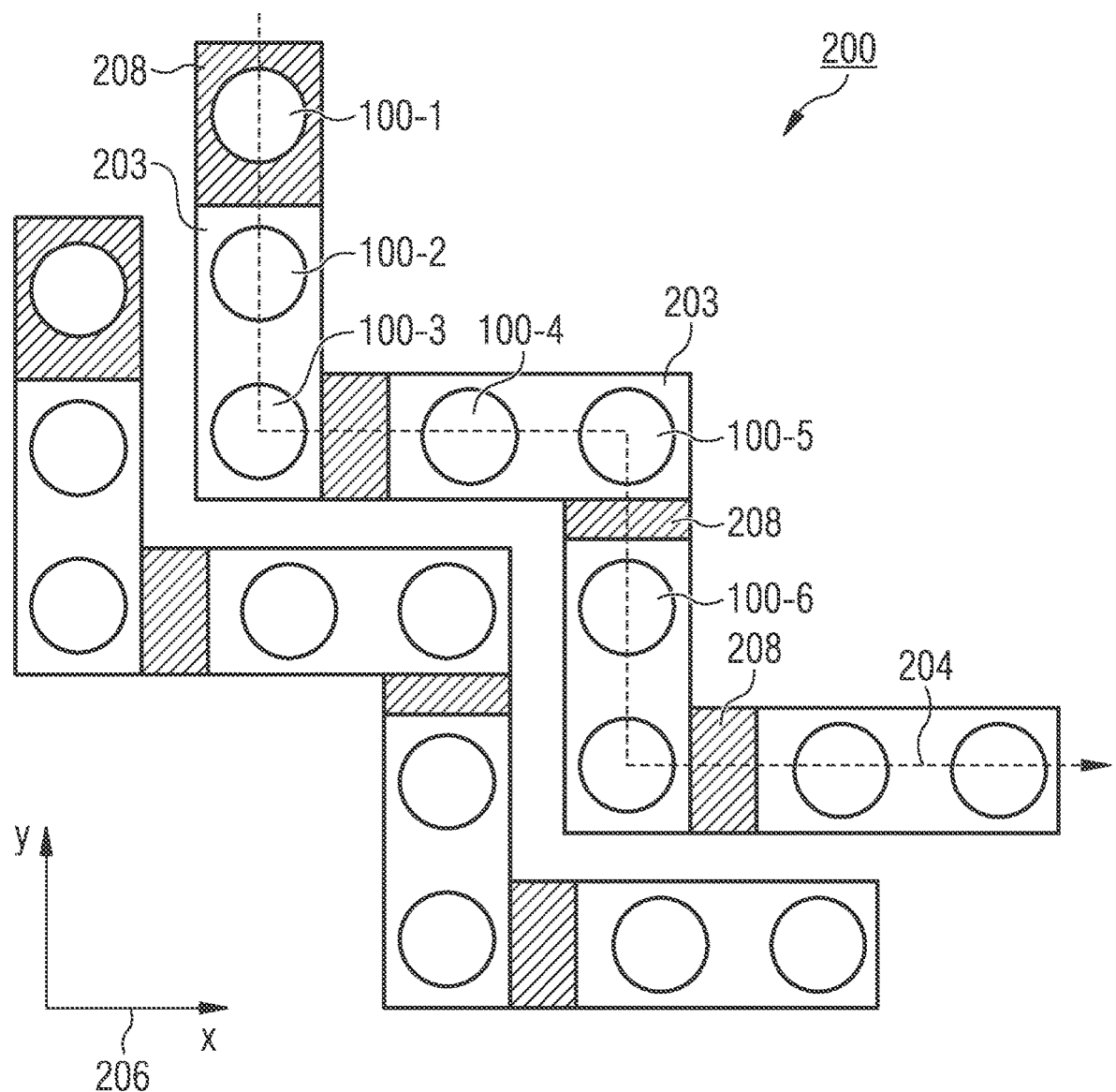
FIG. 6 shows a TMR sensor that combines parallel and perpendicular current flows within a resistance.

In the case of the example implementations of TMR sensor devices 200 illustrated in FIGS. 5 and 6, the series-connected TMR resistance elements 100 are arranged and electrically interconnected or connected on the substrate 202 in such a way that an electric current flow direction 204 in the (x-y-) plane relative to the reference magnetization 206 changes at least once along the current path through the series-connected TMR resistance elements 100. That means, for example, that the electric current flow direction 204 is parallel to the x-direction in some sections of the TMR sensor device 200, and parallel to the y-direction in other sections.

If a two-dimensional tunnel contact matrix on the substrate 202 is assumed, for example, then the lateral current flow through the tunnel contacts or TMR resistance elements 100 can be influenced by an interconnection of the tunnel contacts using the upper and lower metal layers 203, 208. While in FIG. 2 laterally adjacent upper and lower metal layers 203, 208 are arranged in such a way that they connect the TMR resistance elements 100 to one another either from left to right (in the x-direction) or from top to bottom (in the y-direction), laterally adjacent upper and lower metal layers 203, 208 can be arranged for example in such a way that they connect a first subset of TMR resistance elements 100 to one another from left to right (in the x-direction) and connect a second subset of TMR resistance elements 100 to one another from top to bottom (in the y-direction). As a result, it is possible to attain a combination of current flow 204 parallel and perpendicular to the reference magnetization 206 within a TMR sensor device.

FIG. 5 schematically shows a first subset 500-x of TMR resistance elements on the substrate 202, through which the electric current flows in the x-direction between TMR resistance elements that are laterally adjacent on the substrate. FIG. 5 schematically also shows a second subset 500-y of TMR resistance elements on the substrate 202, through which the electric current flows in the y-direction between TMR resistance elements that are laterally adjacent on the substrate. This can be achieved by way of correspondingly arranged upper and lower contactings 203, 208, which connect the first subset 500-x of laterally adjacent TMR resistance elements to one another in the x-direction and connect the second subset 500-y of laterally adjacent TMR resistance elements to one another in the y-direction.

If a reference magnetization 206 of all the TMR resistance elements on the substrate in the x-direction is assumed, then the current flow direction 204 through the first subset 500-x of TMR resistance elements is parallel to the reference magnetization 204, while the current flow direction 204 through the second subset 500-y of TMR resistance elements is perpendicular to the reference magnetization 206. In order to obtain a uniform distribution of the two current flow directions, the first subset 500-x and the second subset 500-y can have an identical number of TMR resistance elements or tunnel contacts. In general, a size of the first subset 500-x and of the second subset 500-y can also be adapted to given ambient conditions of the sensor device 200.

FIG. 6 shows TMR resistance elements 100 connected in series via upper and lower contactings 203, 208, wherein a resulting current path through the TMR resistance elements 100 runs in the y-direction in some sections and in the x-direction in some sections.

The TMR resistance element 100-1 and the laterally adjacent TMR resistance element 100-2 in the y-direction are electrically connected to one another in the y-direction via the lower metallization layer 208. The current path from TMR resistance element 100-1 to TMR resistance element 100-2 thus runs in the x-y-plane in the y-direction via the lower metallization layer 208. From the lower metallization layer 208 the current path then runs perpendicular (in the z-direction) through the TMR resistance element 100-2 from the lower metallization layer 208 to the upper metallization layer 203. The TMR resistance element 100-2 and the laterally adjacent TMR resistance element 100-3 in the y-direction are electrically connected to one another in the y-direction via the upper metallization layer 203, such that the current path runs further in the y-direction from TMR resistance element 100-2 to TMR resistance element 100-3.

The TMR resistance element 100-3 and the TMR resistance element 100-4 laterally adjacent thereto in the x-direction are electrically connected to one another in the x-direction via the lower metallization layer 208, such that a change in direction of the current path from the y-direction to the x-direction occurs at this location. The current path from TMR resistance element 100-3 to TMR resistance element 100-4 thus runs in the x-y-plane in the x-direction via the lower metallization layer 208. From the lower metallization layer 208 the current path then runs perpendicular (in the z-direction) through the TMR resistance element 100-4 from the lower metallization layer 208 to the upper metallization layer 203 and from there further to the laterally adjacent TMR resistance element 100-5 in the x-direction. A change in the current flow direction then occurs again between the TMR resistance element 100-5 and the laterally adjacent TMR resistance element 100-6 in the y-direction, etc.

Although in the example implementations shown the first current flow direction (x-direction) through the first subset of TMR resistance elements is perpendicular to the second current flow direction (y-direction) through the second subset of TMR resistance elements, example implementations are also conceivable in which the current flow directions are not perpendicular to one another. By way of example, the two current flow directions could also form an angle of 45°.

Example implementations of the present disclosure can improve the robustness of a sensor vis-à-vis lifetime and temperature drift. As a result, an accuracy of the sensors can be increased, such that it is possible to profit from a better defined design window.

A specific geometry of the sensor layout in conjunction with the integration process either supports the reference magnetization configuration (parallel) or destabilizes it (perpendicular case). For the stablest possible performance, the current flow/metal line direction should therefore be aligned parallel to the reference magnetization direction (FIG. 2, left). In cases in which the reference magnetization can vary, a mixture of x- and y-current flow direction within the resistances is preferable in order to ensure an identical behavior over the entire lifetime and under different loads.

The aspects and features that have been described in association with a specific one of the examples above can also be combined with one or more of the further examples in order to replace an identical or similar feature of this further example or in order additionally to introduce the feature into the further example.

It furthermore goes without saying that the disclosure of a plurality of steps, processes, operations or functions disclosed in the description or the claims should not be interpreted as being mandatory in the order described, unless this is explicitly indicated or absolutely necessary for technical reasons in an individual case. Therefore, the preceding description does not limit the implementation of a plurality of steps or functions to a specific order. Furthermore, in further examples, an individual step, an individual function, an individual process or an individual operation can include a plurality of partial steps, partial functions, partial processes or partial operations and/or be subdivided into them.

When some aspects in the preceding sections have been described in association with a device or a system, these aspects should also be understood as a description of the corresponding method. In this case, for example, a block, a device or a functional aspect of the device or of the system can correspond to a feature, for instance a method step, of the corresponding method. Analogously thereto, aspects described in association with a method should also be understood as a description of a corresponding block, a corresponding element, a property or a functional feature of a corresponding device or a corresponding system.

The claims that follow are hereby incorporated in the detailed description, where each claim can be representative of a separate example by itself. Furthermore, it should be taken into consideration that—although a dependent claim refers in the claims to a specific combination with one or more other claims—other examples can also encompass a combination of the dependent claim with the subject of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

What is claimed is:

1. A magnetic sensor device, comprising:
   a substrate spanning a plane; and
   a plurality of series-connected tunnel magnetoresistance (TMR) resistance elements arranged on the substrate, wherein each TMR resistance element, of the plurality of series-connected TMR resistance elements, has at least one magnetic tunnel contact, and wherein each TMR resistance element, of the plurality of series-connected TMR resistance elements, has a same reference magnetization,
   wherein the plurality of series-connected TMR resistance elements are arranged and interconnected on the substrate in such a way that an electric current flow direction in the plane relative to the same reference magnetization changes from a first direction in the plane to a second direction in the plane at least once along a current path through the plurality of series-connected TMR resistance elements.

2. The magnetic sensor device as claimed in claim 1, comprising:
   a first subset of the plurality of series-connected TMR resistance elements, through which an electric current has a first current flow direction in the plane; and
   at least one second subset of the plurality of series-connected TMR resistance elements, through which the electric current has a second current flow direction in the plane, which differs from the first current flow direction.

3. The magnetic sensor device as claimed in claim 2, wherein the first subset of the plurality of series-connected TMR resistance elements and the second subset of the plurality of series-connected TMR resistance elements are arranged and interconnected on the substrate such that the first current flow direction through the first subset of the plurality of series-connected TMR resistance elements is perpendicular to the second current flow direction through the second subset of the plurality of series-connected TMR resistance elements.

4. The magnetic sensor device as claimed in claim 2, wherein the first subset of the plurality of series-connected TMR resistance elements and the second subset of the plurality of series-connected TMR resistance elements are arranged and interconnected on the substrate such that the first current flow direction through the first subset of the plurality of series-connected TMR resistance elements is parallel to the reference magnetization and the second current flow direction through the second subset of the plurality of series-connected TMR resistance elements is perpendicular to the reference magnetization, or the first current flow direction through the first subset of the plurality of series-connected TMR resistance elements is perpendicular to the reference magnetization and the second current flow direction through the second subset of the plurality of series-connected TMR resistance elements is parallel to the reference magnetization.

5. The magnetic sensor device as claimed in claim 1, wherein a first subset of the plurality of series-connected TMR resistance elements and a second subset of the plurality of series-connected TMR resistance elements have an identical number of TMR resistance elements.

6. The magnetic sensor device as claimed in claim 1, wherein the reference magnetization of the plurality of series-connected TMR resistance elements runs parallel to the plane spanned by the substrate.

7. The magnetic sensor device as claimed in claim 1, wherein the at least one magnetic tunnel contact of each of the plurality of series-connected TMR resistance elements are connected between a first contacting plane and a second contacting plane on the substrate and the current path extends perpendicular to the plane through the at least one magnetic tunnel contact of each of the plurality of series-connected TMR resistance elements and in the plane laterally through the first contacting plane and the second contacting plane.

8. The magnetic sensor device as claimed in claim 1, wherein each TMR resistance element, of the plurality of series-connected TMR resistance elements, has a free layer in a vortex configuration.

9. A magnetic sensor device, comprising:
a substrate spanning a plane; and
a plurality of series-connected tunnel magnetoresistance (TMR) resistance elements arranged on the substrate, wherein each TMR resistance element, of the plurality of TMR resistance elements, has at least one magnetic tunnel contact, and wherein each TMR resistance element, of the plurality of series-connected TMR resistance elements has a same reference magnetization,
wherein the plurality of series-connected TMR resistance elements are arranged and interconnected on the substrate in such a way that a first electric current flow direction in a plane parallel to the reference magnetization and a second electric current flow direction in the plane perpendicular to the reference magnetization results along a current path through the plurality of series-connected TMR resistance elements.

10. The magnetic sensor device as claimed in claim 9, wherein the reference magnetization of the plurality of series-connected TMR resistance elements runs parallel to the plane spanned by the substrate.

11. The magnetic sensor device as claimed in claim 9, wherein the at least one magnetic tunnel contact of each of the TMR resistance elements, of the plurality of series-connected TMR resistance elements, are connected between a first contacting plane and a second contacting plane on the substrate and the current path extends perpendicular to the plane through the at least one magnetic tunnel contact of each of the TMR resistance elements, of the plurality of series-connected TMR resistance elements, and in the plane parallel to the reference magnetization through the first contacting plane and the second contacting plane.

* * * * *